United States Patent [19]

Rice et al.

[11] 4,233,477
[45] Nov. 11, 1980

[54] FLEXIBLE, SHAPEABLE, COMPOSITE ACOUSTIC TRANSDUCER

[75] Inventors: Roy W. Rice, Alexandria; Robert C. Pohanka, Springfield, both of Va.

[73] Assignee: The United States of America as represented by the Secretary of the Navy, Washington, D.C.

[21] Appl. No.: 8,028

[22] Filed: Jan. 31, 1979

[51] Int. Cl.³ .................. H01L 41/10; H04R 17/00
[52] U.S. Cl. .................. 179/110 A; 310/334; 310/369
[58] Field of Search .......... 179/110 A, 110 R, 1 UW; 29/25.35, 594; 310/334, 337, 369

[56] References Cited

U.S. PATENT DOCUMENTS

| | | | |
|---|---|---|---|
| 2,411,146 | 11/1946 | Clement | 179/110 A X |
| 2,911,484 | 11/1959 | Spitzer et al. | 179/110 A |
| 3,396,286 | 8/1968 | Anderson et al. | 310/334 |
| 3,423,543 | 1/1969 | Kompanek | 179/110 A |
| 3,924,259 | 12/1975 | Butler et al. | 310/334 X |
| 3,992,693 | 11/1976 | Martin et al. | 310/337 X |
| 4,118,649 | 10/1978 | Shwartzman et al. | 310/337 |

OTHER PUBLICATIONS

"Real-time Imaging of Internal Body Structures," *ULTRASONICS*, Nov., 1974, p. 235.

*Primary Examiner*—Thomas W. Brown
*Attorney, Agent, or Firm*—R. S. Sciascia; Philip Schneider; Melvin L. Crane

[57] ABSTRACT

A flexible, composite, acoustical energy transducer made from ferroelectric, piezoelectric, and/or electrostrictive materials in combination with a polymer, such as silicone or polyvinylidene fluoride ($PVF_2$), preferably having electroelastic properties. The materials are formed into platelets or wafers which have electrodes on their facial surfaces and are arranged within the polymer with each wafer in the same x-y plane such that their polarizations are in the same direction and perpendicular to the x-y plane. The wafers are aligned in directed rows, spaced from each other and are totally encased within the polymer. Thin conductive sheet or foil electrodes are secured to the upper and lower faces of the polymer and a conductive material between each wafer and the foil electrically connects the wafers to the foil electrodes. To protect the electrodes and prevent electrical shorting, a rubber coating or any other suitable insulator may be applied to the outside of the electrodes. The polymer is flexible and therefore the transducer can be formed into most any desired shape or placed on a flat or curved surface.

9 Claims, 3 Drawing Figures

FLEXIBLE, SHAPEABLE, COMPOSITE ACOUSTIC TRANSDUCER

BACKGROUND OF THE INVENTION

This invention relates to acoustical energy transducers and more particularly to a flexible, moldable or shapeable acoustic transducer material with a high piezoelectric voltage coefficient to convert acoustical energy into electrical energy and vice versa.

Heretofore, most electroacoustical transducers have made use of one or more piezoelectric ceramic elements. These elements are formed into specific shapes such as rings or cylinders. Because of the brittle nature of the material, once the ceramic shape has been formed and processed, the shape cannot be changed. Thus, while having good electroelastic properties, prior-art ceramic transucers can only operate with fixed shapes.

Flexible piezoelectric materials include polymers such as polyvinylidene fluoride (PVF$_2$) or ceramic-polymer composites. Ceramic-polymer composites have been made by imbedding powders or particles of a piezoelectric ceramic in a polymer matrix. The composite material is then polarized by the application of an electric field. Due to the lack of electrical continuity due to isolation of the piezoelectric particles, only partial polarization is achieved. The lack of polarization results in low electroelastic properties. Also, high permittivity powders are surrounded by low permittivity polymers and only low permittivity materials have been previously fabricated, which prohibits active transducer operation. Assemblies of the above composites have low electroelastic properties; i.e., low permittivity, low coupling and low voltage response. A big factor that has limited the development of flexible, piezoelectric composites has been the lack of poling of the ceramic powders or particles in the assemblies.

SUMMARY OF THE INVENTION

This invention is directed to acoustical energy transducers formed by a composite material comprising electroacoustic (ferroelectric, piezoelectric or electrostrictive) ceramic wafers or platelets (mm size) arranged in the same x-y plane within a flexible, preferably electroelastic, polymer such as silicone or PVF$_2$. The wafers are axially polarized prior to placement into the composite, electroded on their surface and oriented in a specific direction when placed within the composite. The polarization is perpendicular to the plane of the wafer (designated herein as "axial polarization") and all wafers are oriented so that their positive poles are on the same side of the plane passing through all the wafers. The composite includes thin, parallel, plate-like foil conductors, secured to the outer surfaces of the polymer with each of the ceramic wafers electrically connected between the foil conductors. Signals applied to the foil conductors produce an output acoustical signal depending upon the input signals. Acoustical signals applied to the composite produce an electrical current flow depending upon the applied acoustical signals. Thus, the operation is the same as for well known piezoelectric transducers. The composite is flexible so it can be made into different shapes, such as flat, bent, cylindrical, etc., and/or secured to a curved or differently shaped body.

Since discrete wafers of ceramic are used, the amount and spacing of ceramic-to-polymer can be fully controlled allowing for tailoring of the permittivity and flexibility. Stress can be concentrated in the wafers to give a maximum voltage response, and the wafers can be addressed by electric fields thus allowing active operation and beam formation in a flexible material.

DETAILED DESCRIPTION

Figure 1:
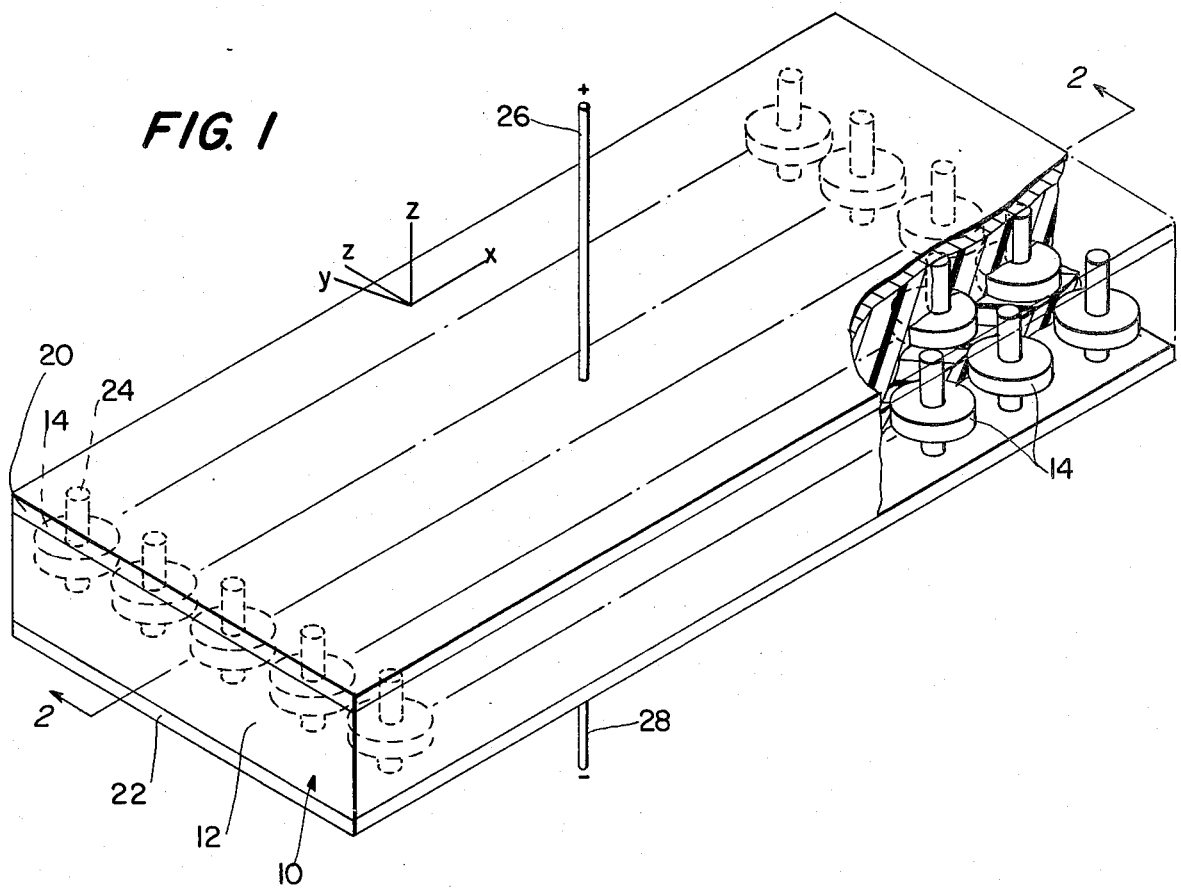
FIG. 1 illustrates a flexible transducer partially cut away to show the relative parts.
Figure 2:
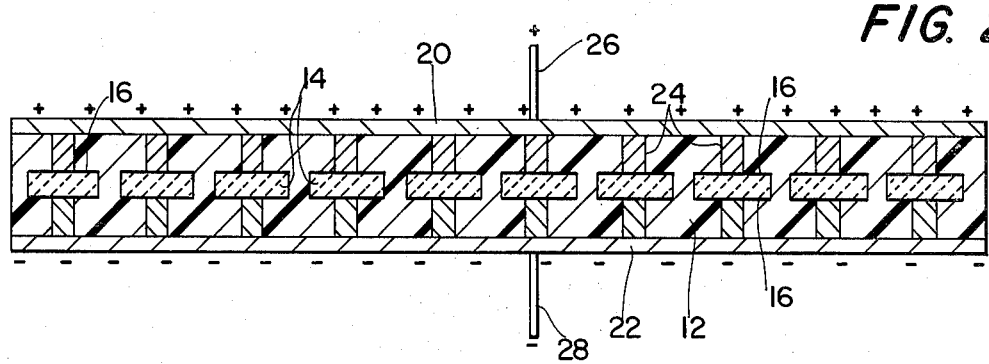
FIG. 2 is a cross sectional view of FIG. 1 taken across a line of piezoelectric wafers.

Now referring to the drawing, FIGS. 1 and 2 show a flexible transducer 10 comprising a flexible polymer 12 such as silicone or polyvinylidene fluoride (PVF$_2$) within which a plurality of thin wafers or platelets 14 made of an electroacoustic (ferroelectric, piezoelectric, or electrostrictive) dielectric material are placed. (The electroacoustic material of the wafer may be of the ferromagnetic, piezoelectric, or electrostrictive dielectric type, especially an electroacoustic ceramic material.)

Also, although it is only necessary that the polymer be flexible, it is preferable that it also be electroelastic. This quality provides an increase in output of the composite device and the capability of tailoring the permittivity of the composite structure over a desired range.

The silicone or PVF$_2$ polymer permits shaping the composite in any desired shape. The curvature is dictated by the diameter and spacing of the wafers which permits flexing of the polymer in the areas between the wafers. Each of the wafers is electroded (16), FIG. 2, on its flat surfaces with a conductive material such as silver and is axially polarized prior to placement in the polymer. When placed in the polymer, the wafers are all placed in aligned rows in the same x-y plane and oriented with the direction of their polarization in the same direction, viz., perpendicular to the x-y plane. Each of the wafers is connected to parallel conductive foils 20 and 22 by use of a solder dot 24 on each side thereof placed within a hole in the polymer that extends to the surface of the wafer. The conductive foil may be made of copper and secured to the surfaces of the polymer and to the solder dots by any well known means such as by thermocompression bonding or by the use of a suitable cement. Electrical means 26 and 28 are connected to the foil electrodes for sending electrical signals to the wafers or receiving signals from the wafers. The wafers react to electrical signals to produce an acoustic-signal or they react to incident acoustical signals to produce an electrical signal as is well known in the art of piezoelectric ceramic material transducers.

In carrying out the teaching of the invention, the ceramic wafers may be made very thin, from approximately 0.025 mm to about 5 mm in thickness, and with diameters from about 1 mm to about 50 mm. The curvature of the composite depends upon the diameter of the wafers, since the composite does not bend in the areas containing the wafers. Since the wafers are not bent during shaping, the smaller the diameter of the wafer, the greater the flexibility of the composite. The wafers may be placed close together or spaced further apart and the spacings need not be uniform or in perfect alignment. The wafers are not secured to each other; however, each side of each wafer is connected to the adjacent foil electrode.

When the transducer composite is made with electroelastic polymers and electroacoustic ceramic materials, the permittivity of the composite can be tailored between the values of the polymer alone and the ceramic alone by the amount and spacing of the polymer and ceramic. It has been determined that permittivities between 25 and 4000 may be attained.

The electric response of the composite material is optimized by concentrating the sound stress into regions comprising the active ceramic phase. By individually addressing the ceramic phase in the composite active operation, a low frequency of 100 KHZ is made possible. It has been determined that transducers made in accordance with the teaching of this invention have a piezoelectric change response at least equal to ceramic transducers with a voltage response at least five (5) times that of $PVF_2$ and 30 times that of the ceramic alone.

In forming the structure illustrated by FIG. 1, the orientation of each wafer is determined and placed flat in a mold in the desired arrangement with the polarization of each wafer in the same direction. A thin polymer is carefully poured into the mold so as not to disturb the arrangement of the wafers. The polymer is poured to be only the thickness of the wafers. A solder dot is then applied to the up side of each wafer. The polymer is poured in to a thickness of the solder dot and the foil electrode is fixed to each solder dot. The wafer polymer is turned over and solder dots are placed on this side of each wafer. The polymer is then poured in to a level with the solder dots. The foil electrode is then fixed to the solder dots and the transducer is completed except for the protective cover which can be added. Obviously, other methods may be used to assemble the transducer.

It has been set forth above that the wafers are polarized before assembly. They could possibly be polarized after assembly; however, it is preferable that they be polarized before assembly.

The composite transducer as shown in FIGS. 1 and 2 may be formed into a length of "cable" and used in the water as a transmitter or receiver. The electrical output signal is directed from the cable to an amplifier and associated equipment for detection of acoustical wave signals. It will be obvious that an amplifier chip or chips may be assembled within the composite structure and the electrical signal from each of the ceramic wafers fed into the chip or chips. The signal from the chip would be stronger than that from the wafers and could be more easily processed. Thus, the transducer cable assembly could carry its own amplifier system and would be more effective.

Figure 3:
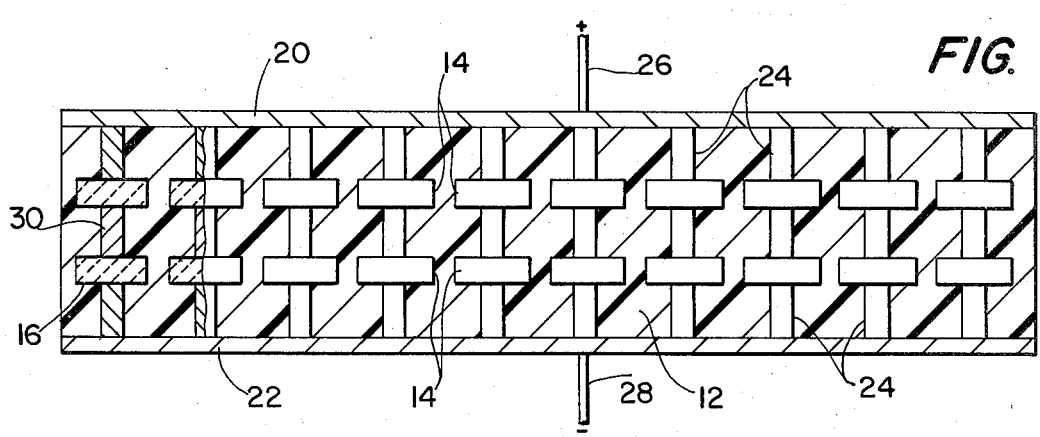
FIG. 3 shows a modification which includes two planar rows of ceramic wafers in the same polymer.

The composite, as shown in FIGS. 1 and 2, can be modified in various ways. FIG. 3 illustrates a composite with two layers of ceramic wafers. The opposing faces of the ceramic wafers are electrically connected to each other by a conductive material 30 and the outer surfaces of each wafer are electrically connected to the conductive foils. Such devices are not as flexible as shown in FIG. 2 but will have a greater output due to the greater number of wafers. When in an unflexed condition the two layers of wafers will be substantially parallel.

In the use of the above described composite as a transducer in water, it will be necessary that the electrically conductive films be insulated from the surrounding medium. This can be done by use of a thin rubber insulation which does not interfere with the acoustical energy. Also, bending or flexing of the composite for different shapes is limited by the ability of the conductive films to withstand the stresses and strains during flexing or bending. Therefore flexure of the device will be restricted by the flexibility of the protective and conductive sheets.

Since the ceramic wafers are assembled in a flexible and/or moldable or shapeable acoustic transducer material, the composite assembly could be secured to any desired area of a ship for transducer operation. The securing surface, provided it is made from metal or a good electrically conductive material, could serve as one electrode. The other electrode would be covered with an insulating covering such as a flexible rubber which would not interfere with operation of the ceramic elements within the composite assembly. Such elements may be attached to several different areas of the ship for receiving and sending acoustical energy from and in different directions.

Obviously many modifications and variations of the present invention are possible in light of the above teachings. It is therefore to be understood that within the scope of the appended claims the invention may be practiced otherwise than as specifically described.

What is claimed and desired to be secured by Letters Patent of the United States is:

1. A flexible, shapeable, composite acoustic transducer which comprises:
    a flexible polymer;
    a plurality of polarized and electroded electroacoustic wafers assembled within said polymer in an x-y plane,
        each of said wafers being oriented with its line of polarization in the same direction as those of the others and all having their positive poles on the same side of the x-y plane;
    electrically conductive foils on opposite surfaces of said polymer;
    means providing a conductive path between opposite faces of each of said electroacoustic wafers and each of said conductive foils; and
    electrical leads electrically secured to each of said foils for conducting an electrical signal to or from said wafers.

2. A transducer as claimed in claim 1 wherein:
said electroacoustic wafers are ceramic.

3. A transducer as claimed in claim 2 in which:
said polymer is silicone.

4. A transducer as claimed in claim 2 wherein:
said polymer is polyvinylidene fluoride.

5. A transducer as claimed in claim 2 wherein:
said ceramic wafer is selected from a ferroelectric, piezoelectric, or electrostrictive material.

6. A transducer as claimed in claim 3 wherein:
said ceramic is piezoelectric.

7. A transducer as claimed in claim 4 wherein:
said ceramic is piezoelectric.

8. A transducer as claimed in claim 2 wherein:
said wafers have a thickness of from about 0.025 mm to about 5.0 mm with a diameter from about 1 mm to about 50 mm.

9. A flexible, shapeable, composite acoustic transducer which comprises:
    a flexible polymer;
    more than one planar assembly of polarized and electroded electro-acoustic wafers assembled within said polymer in parallel x-y planes, each of said wafers of each planar assembly being oriented with its line of polarization in the same direction as those of the others and all having their positive poles on the same side of its x-y plane;

electrically conductive foils on opposite surfaces of said polymer;

means providing a conductive path between said conductive foils and the faces of each of said electroacoustic wafers adjacent each of said conductive foils and between adjacent faces of said electroacoustic wafers; and electrical leads electrically secured to each of said foils for conducting an electrical signal to or from said wafers.

* * * * *